US012719408B2

(12) United States Patent
Lv et al.

(10) Patent No.: US 12,719,408 B2
(45) Date of Patent: Aug. 25, 2026

(54) RC OSCILLATOR CIRCUIT

(71) Applicant: IPGoal Microelectronics (Sichuan) Co., Ltd., Chengdu (CN)

(72) Inventors: Yalan Lv, Chengdu (CN); Xiangyang Guo, Chengdu (CN)

(73) Assignee: IPGOAL MICROELECTRONICS (SICHUAN) CO., LTD., Chengdu (CN)

( * ) Notice: Subject to any disclaimer, the term of this patent is extended or adjusted under 35 U.S.C. 154(b) by 0 days.

(21) Appl. No.: 18/983,574

(22) Filed: Dec. 17, 2024

(65) Prior Publication Data

US 2025/0119097 A1 Apr. 10, 2025

(30) Foreign Application Priority Data

Apr. 26, 2024 (CN) ........................ 202410510806.9

(51) Int. Cl.
*H03B 5/24* (2006.01)

(52) U.S. Cl.
CPC .................................... *H03B 5/24* (2013.01)

(58) Field of Classification Search
CPC .................................. H03B 5/24; H03B 5/04
See application file for complete search history.

(56) References Cited

U.S. PATENT DOCUMENTS

| | | | | |
|---|---|---|---|---|
| 6,020,792 A * | 2/2000 | Nolan | H03K 3/0231 | |
| | | | 331/111 | |
| 7,034,627 B1 * | 4/2006 | Kudari | H03K 3/0231 | |
| | | | 331/111 | |
| 8,525,568 B2 * | 9/2013 | Wu | H03K 4/501 | |
| | | | 327/299 | |
| 11,043,936 B1 * | 6/2021 | Wu | H03K 4/501 | |
| 2017/0353158 A1 * | 12/2017 | Hsu | H03K 3/011 | |

FOREIGN PATENT DOCUMENTS

CN 111988019 A 11/2020

* cited by examiner

*Primary Examiner* — Jeffrey M Shin
(74) *Attorney, Agent, or Firm* — SHIMOKAJI IP

(57) ABSTRACT

An RC oscillator circuit is provided. An output terminal of the first current source unit is connected to the oscillation resistor and non-inverting inputs of the comparators, and the other end of the oscillation resistor is grounded. The second current source unit has two output terminals. Sources of the two oscillation MOS transistors are grounded, drains of the oscillation MOS transistors are connected to a corresponding oscillation capacitor, and gates of the oscillation MOS transistors are connected to an output of the RS latch. The first current source unit includes four MOS transistors and a first resistor. The frequency of the output clock signal is unaffected by substrate bias effects of MOS transistors and resistor variations, thereby ensuring a highly stable output frequency with minimal deviation, and greatly improving the reliability and stability of the RC oscillator circuit.

6 Claims, 3 Drawing Sheets

RC OSCILLATOR CIRCUIT

FIELD OF THE INVENTION

The present invention relates to the field of integrated circuits, and more specifically to an RC oscillator circuit.

BACKGROUND OF THE INVENTION

The RC oscillator is a common electronic oscillator used to generate a stable alternating signal. It consists of resistors (R) and capacitors (C) and utilizes the characteristics of the RC network to achieve oscillation. Therefore, RC oscillators have wide applications in fields such as communications, computers, and audio.

The core component of an RC oscillator is an RC network composed of resistors and capacitors. Through positive feedback during the continuous charge and discharge process, the circuit generates self-sustained oscillation. The circuit structure can be referenced in FIG. 1. As shown in FIG. 1, in the operation of the RC oscillator, the current Icharge1 charges the capacitor Cint1. After charging to the value Vref within time Tint, the comparator COMP1 is reversed, clearing the charge on Cint1 and causing the comparator COMP1 to be reversed again. The process then repeats for capacitor Cint2, charging to the value Vref within time Tint, and the comparator COMP2 is reversed, clearing the charge on Cint2 and causing the comparator COMP2 to be reversed again. Thus, the RC oscillator circuit starts oscillating, with the oscillation period being 2Tint.

In the aforementioned RC oscillator circuit, by neglecting the delay in the comparators and the parasitic capacitance on the negative terminal of the comparators, and assuming that the currents Icharge and Iref originate from the same bias circuit with a current ratio K, i.e., $$K = \frac{Icharge}{Iref},$$

and Icharge1=Icharge2=IchargeI, Cint1=Cint2=Cint, the following equation for charge can be derived:

$$Q = C * U = I * T \tag{1}$$

From equation (1), the charge/discharge time can be derived as:

$$Tint = \frac{Cint * Vref}{Icharge} = \frac{Cint * Iref * Rref}{Icharge} \tag{2}$$

From equation (2), the output frequency can be derived as:

$$F = \frac{1}{2Tint} = \frac{Icharge}{2Cint * Iref * Rref} \tag{3}$$

As described above, since the currents Icharge and Iref originate from the same bias circuit and have a ratio K, the output frequency can be obtained as follows:

$$F = \frac{1}{2Tint} = \frac{1}{2K * Cint * Rref} \tag{4}$$

It can be seen that the frequency F of the RC oscillator is inversely proportional to the values of the resistor Rref and capacitor Cint. Additionally, process variations affect the resistor and capacitor, especially the resistor, which tends to vary with process temperature. Furthermore, substrate bias effects during the generation of currents Icharge and IrefI are disregarded, resulting in extreme instability in the output frequency F, which reduces product reliability.

Thus, there is a need for an improved RC oscillator circuit to overcome the above shortcomings.

SUMMARY OF THE INVENTION

The purpose of the present invention is to provide an RC oscillator circuit where the frequency of the output clock signal is unaffected by substrate bias effects of MOS transistors and resistor variations, ensuring a highly stable frequency of the output clock signal with minimal deviation, thereby greatly improving the reliability and stability of the RC oscillator circuit.

To achieve the above objectives, the present invention provides an RC oscillator circuit including a first current source unit, a second current source unit, an oscillation resistor, a first oscillation capacitor, a second oscillation capacitor, two oscillation MOS transistors, two comparators, and an RS latch. An input terminal of the first current source unit and an input terminal of the second current source unit are connected to an external power supply, the first current source unit is configured to generate a first current, an output terminal of the first current source unit is connected to one end of the oscillation resistor and non-inverting inputs of the two comparators, and the other end of the oscillation resistor is grounded. The second current source unit is configured to generate a second current and provided with two output terminals, one of the output terminals is connected to one end of the first oscillation capacitor and an inverting input of one of the two comparators, with the other end of the first oscillation capacitor grounded, and the other of the output terminals is connected to one end of the second oscillation capacitor and an inverting input of the other of the two comparators, with the other end of the second oscillation capacitor grounded. Sources of the two oscillation MOS transistors are grounded, drains of the two oscillation MOS transistors are connected to one end of a corresponding oscillation capacitor, and gates of the two oscillation MOS transistors are both connected to an output of the RS latch; output terminals of the two comparators are connected to an input terminal of the RS latch, and the RS latch is configured to output a clock signal. The first current source unit comprises a first MOS transistor, a second MOS transistor, a third MOS transistor, a fourth MOS transistor, and a first resistor; sources of the first and second MOS transistors are grounded, a drain of the first MOS transistor and a gate of the second MOS transistor are connected together to one end of the first resistor, the other end of the first resistor is connected to a gate of the first MOS transistor and a drain of the third MOS transistor, drains of the third and fourth MOS transistors are connected to the external power supply, and the drain and gate of the fourth MOS transistor are connected together to a gate of the third MOS transistor and a drain of the second MOS transistor.

As a preferable embodiment, the second current source unit comprises a fifth MOS transistor, a sixth MOS transistor, a seventh MOS transistor, an eighth MOS transistor, and a second resistor; sources of the fifth and sixth MOS transistors are grounded, drains of the fifth and seventh MOS transistors are connected together to gates of the seventh and eighth MOS transistors, a source of the seventh MOS transistor and one end of the second resistor are connected to the external power supply, with the other end of the second resistor connected to a source of the eighth MOS transistor; and the drain and gate of the sixth MOS transistor are connected together to a gate of the fifth MOS transistor and a drain of the eighth MOS transistor.

As a preferable embodiment, the third MOS transistor and the fourth MOS transistor have a same width-to-length ratio.

As a preferable embodiment, a gate-source voltage of the first MOS transistor is denoted as $V_{GS1}$, a current generated by the first current source unit is denoted as $I_{ref}$, a resistance value of the first resistor is denoted as Rs, a gate-source voltage of the second MOS transistor is denoted as $V_{GS2}$, and a drain current of the second MOS transistor is denoted as $I_{out}$, based on the KVL equation, it's yielded that:

$$V_{GS1} = \sqrt{\frac{2Iref}{\mu_n C_{ox}\left(\frac{W}{L}\right)_1}} + V_{TH1},$$

$$V_{GS2} = \sqrt{\frac{2Iout}{\mu_n C_{ox}\left(\frac{W}{L}\right)_2}} + V_{TH2},$$

where $$\left(\frac{W}{L}\right)_2, \left(\frac{W}{L}\right)_1$$

represent a width-to-length ratio of the second MOS transistor and a width-to-length ratio of the first MOS transistor respectively, and a ratio of the width-to-length ratio of the second MOS transistor to the width-to-length ratio of the first MOS transistor is denoted as N1; $V_{TH1}$ and $V_{TH2}$ represent threshold voltages of the first and second MOS transistors, respectively; $\mu_n$ represents a channel mobility, and $C_{OX}$ represents a gate oxide capacitance per unit area; furthermore, assuming $I_{out}=I_{ref}$, a current $I_{ref}$ generated by the first current source unit can be obtained as follows:

$$I_{ref} = \frac{2}{\mu_n C_{ox}\left(\frac{W}{L}\right)_1} * \frac{1}{R_s^2} * \left(1 - \frac{1}{\sqrt{N1}}\right)^2. \qquad (1)$$

As a preferable embodiment, a ratio of a width-to-length ratio of the eighth MOS transistor to a width-to-length ratio of the seventh MOS transistor is denoted as N2, a current generated by the second current source unit is denoted as $I_{charge}$, and a resistance value of the second resistor is denoted as $R_r$, thus:

$$I_{charge} = \frac{V_T * \ln N_2}{R_r}, \qquad (2)$$

where VT represents a thermal voltage.

As a preferable embodiment, the current produced by the first current source unit and the current produced by the second current source unit are proportionally replicated, and the current produced by the second current source unit has two identical replicated currents which are input into corresponding devices.

As a preferable embodiment, by combining equations (1) and (2), a frequency F of the output clock signal of the RC oscillator can be obtained as follows:

$$F = \frac{\mu_n C_{ox}\left(\frac{W}{L}\right)_1 * V_T * \ln N_2}{2 * C_{int}} * \frac{1}{\left(1 - \frac{1}{\sqrt{N1}}\right)^2} * \frac{R_s^2}{R_r R_{ref}},$$

where $R_{ref}$ represents a resistance value of the oscillator resistor.

In comparison with the prior art, in the RC oscillator circuit of the invention, the sources of the first MOS transistor, the second MOS transistor, the fifth MOS transistor and the MOS transistor in the first current source unit and the second current source unit are grounded, so that the substrates of these MOS transistors are also directly grounded, thus the current generated by these MOS transistors will not bring a substrate bias effect. Moreover, when calculating the frequency of the output clock signal, the process temperature deviation caused by the resistors is also compensated. Therefore, the output frequency of the RC oscillator circuit in this invention is unaffected by substrate bias effects and resistance variations, resulting in a stable frequency of the output clock signal with minimal deviation, and greatly enhancing the reliability and stability of the RC oscillator circuit.

BRIEF DESCRIPTION OF THE DRAWINGS

The accompanying drawings facilitate an understanding of the various embodiments according to the present invention. In such drawings.

DETAILED DESCRIPTION OF ILLUSTRATED EMBODIMENTS

Figure 1:
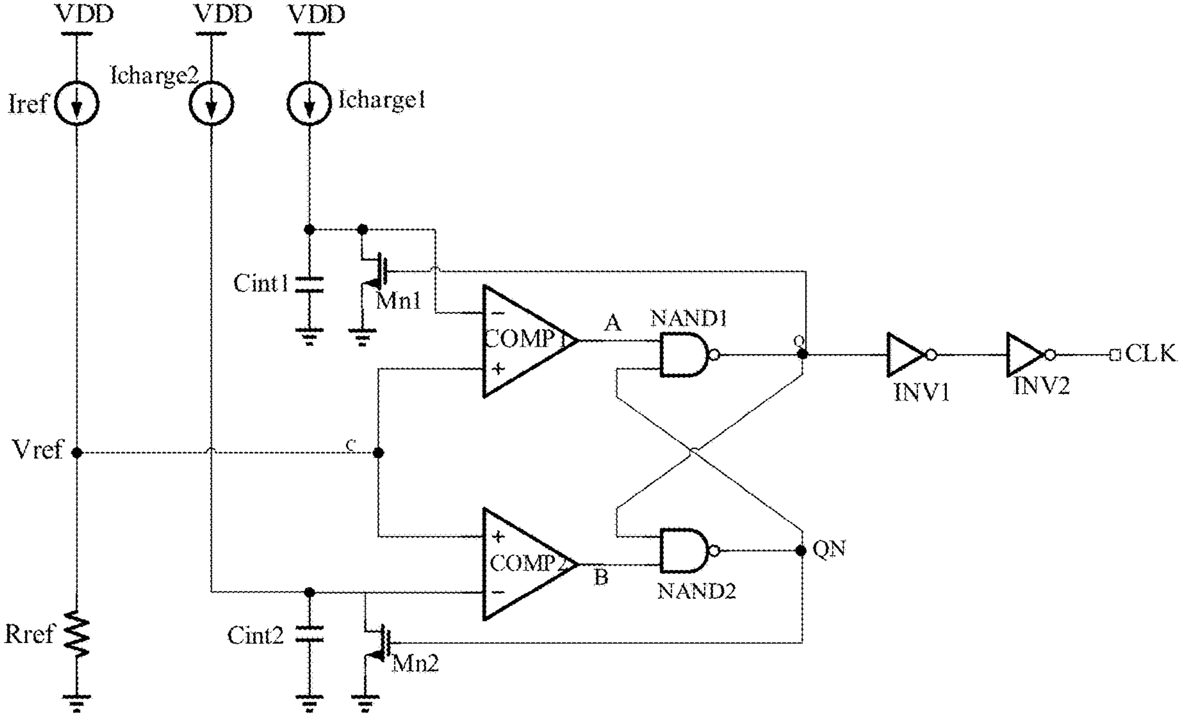
FIG. 1 is a schematic of a conventional RC oscillator circuit.

Referring to the accompanying drawings, the embodiments of the present invention are described. Similar reference numerals in the drawings represent similar elements. As described above, the present invention provides an RC oscillator circuit whose output clock signal frequency remains unaffected by the substrate bias effect of MOS transistors and resistor variations, ensuring a highly stable frequency of the output clock signal with minimal deviation, thereby greatly improving the reliability and stability of the RC oscillator circuit.

Figure 2:
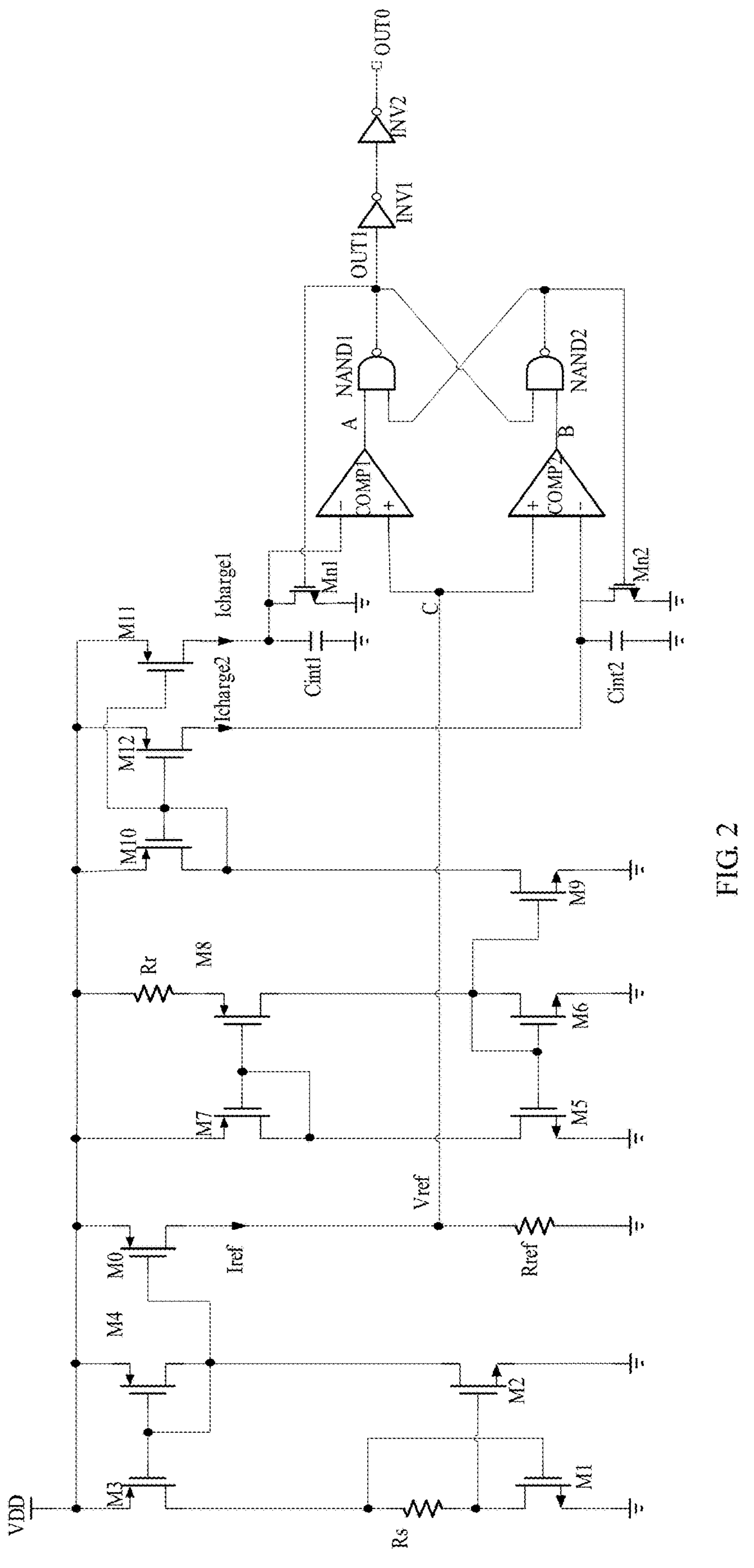
FIG. 2 is a schematic of an RC oscillator circuit according to one embodiment of the present invention.

Referring to FIG. 2, the RC oscillator circuit according to the present invention includes a first current source unit, a second current source unit, an oscillating resistor Rref, a first oscillating capacitor Cint1, a second oscillating capacitor Cint2, two oscillating MOS transistors Mn1 and Mn2, two comparators COMP1 and COMP2, and an RS latch D1. The input terminals of the first and second current source units are connected to an external power source VDD. The first current source unit is configured to output a first current Iref, and its output terminal is connected to one end of the oscillating resistor Rref and the non-inverting inputs of the two comparators COMP1 and COMP2, for supplying the first current Iref to the oscillating resistor Rref and the non-inverting inputs of the two comparators COMP1 and COMP2. The other end of Rref is grounded.

The second current source unit is configured to generate a second current Icharge and has two output terminals, each providing identical currents Icharge1 and Icharge2. One output terminal of the second current source unit is connected to one end of the first oscillating capacitor Cint1 and the inverting input of the comparator COMP1, for supplying the second current Icharge1 to both. The other end of the first oscillating capacitor Cint1 is grounded. The other output terminal of the second current source unit is connected to one end of the second oscillating capacitor Cint2 and the inverting input of the comparator COMP2, with the other end of Cint2 grounded, for supplying the second current Icharge2 to both.

The source of both oscillating MOS transistors Mn1 and Mn2 are grounded. Their drains are each connected to one end of the corresponding oscillating capacitors. Specifically, the drain of the oscillating MOS transistor Mn1 is connected to one end of the first oscillating capacitor Cint1, while the drain of the oscillating MOS transistor Mn2 is connected to one end of the second oscillating capacitor Cint2. The gates of both the oscillating MOS transistors Mn1 and Mn2 are connected to the output of the RS latch. The output terminals of the comparators COMP1 and COMP2 are connected to the input terminals of the RS latch, which outputs the clock signal OUT1. This clock signal OUT1 is shaped by two inverters INV1 and INV2 to produce the final clock signal OUT0. As specifically illustrated in FIG. 2, in this RC oscillator circuit, the second current Icharge1 charges the first oscillating capacitor Cint1 until it reaches the reference voltage Vref within the time Tint, at which point the comparator COMP1 is reversed. After discharging the first oscillating capacitor Cint1, the comparator COMP1 is reversed again, and the charging process shifts to the second oscillating capacitor Cint2. When Cint2 reaches the reference voltage Vref within Tint, the comparator COMP2 is reversed. After discharging the second oscillating capacitor Cint2, the comparator COMP2 is reversed again. In such a way, the oscillation process in the RC oscillator circuit is initiated, with an oscillation period of 2Tint, and ultimately the clock signal OUT0 is outputted.

Figures 3, 4:
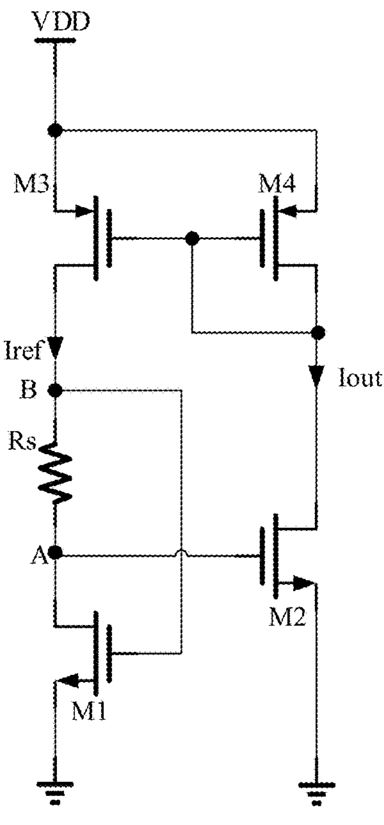
FIG. 3 is a schematic of the first current source unit in the RC oscillator circuit according to one embodiment of the present invention.
FIG. 4 is a schematic of the second current source unit in the RC oscillator circuit according to one embodiment of the present invention.

Specifically, referring to FIGS. 3 and 4, in this invention, the first current source unit includes a first MOS transistor M1, a second MOS transistor M2, a third MOS transistor M3, a fourth MOS transistor M4, and a first resistor Rs. The sources of the MOS transistors M1 and M2 are grounded, ensuring their substrates are also grounded. The drain of the first MOS transistor M1 and the gate of the second MOS transistor M2 are connected together and connected to one end of the first resistor Rs. The other end of the first resistor Rs is connected to the gate of the first MOS transistor M1 and the drain of the third MOS transistor M3. The drains of the MOS transistors M3 and M4 are connected to the external power supply VDD. The drain and gate of the fourth MOS transistor M4 are connected to the gate of the third MOS transistor M3 and the drain of the second MOS transistor M2.

In a preferred embodiment according to the present invention, the third MOS transistor M3 and the fourth MOS transistor M4 have identical width-to-length ratios; for instance, assuming that the width-to-length ratio of the third MOS transistor M3 is represented as $$\left(\frac{W}{L}\right)_3,$$

and the width-to-length ratio of the fourth MOS transistor M3 is represented as $$\left(\frac{W}{L}\right)_4,$$

that is, $$\left(\frac{W}{L}\right)_3 = \left(\frac{W}{L}\right)_4.$$

Additionally, by setting the voltage of the external power supply VDD, the MOS transistors M1, M2, M3, and M4 are operated in the saturation region. As shown in FIG. 3, for calculating the current generated by the first current source unit, the gate voltage of the first MOS transistor M1 is set as VGS1, the first current generated by the first current source unit is set as $I_{ref}$, the resistance of the first resistor is set as Rs, the gate voltage of the second MOS transistor M2 is set as VGS2, and the drain current of the second MOS transistor M2 is set as Iout, furthermore since $$\left(\frac{W}{L}\right)_4 = \left(\frac{W}{L}\right)_3,$$

thus Iout=Iref, based on Kirchhoff's Voltage Law (KVL), it's yielded that $V_B=V_{GS1}=\text{Iref*Rs}+V_{GS2}$. Accordingly, it's yielded that, $$V_{GS1} = \sqrt{\frac{2Iref}{\mu_n C_{ox}\left(\frac{W}{L}\right)_1}} + V_{TH1},$$

$$V_{GS2} = \sqrt{\frac{2Iout}{\mu_n C_{ox}\left(\frac{W}{L}\right)_2}} + V_{TH2};$$

wherein $$\left(\frac{W}{L}\right)_2, \left(\frac{W}{L}\right)_1$$

represent the width-to-length ratios of the second MOS transistor M2 and the first MOS transistor M1, respectively, and assuming the ratio of the width-to-length ratio of the second MOS transistor M2 to the first MOS transistor M1 is defined as N1, that is, $$\frac{\left(\frac{W}{L}\right)_2}{\left(\frac{W}{L}\right)_1} = N1;$$

$V_{TH1}$ and $V_{TH2}$ respectively represent the threshold voltages of the first MOS transistor M1 and the second MOS transistor M2, respectively; $\mu_n$ represents the channel mobility; and $C_{OX}$ represents the gate oxide capacitance per unit area. Both parameters $\mu_n$ and $C_{OX}$ are constants and related to the manufacturing process are constants, which vary across different processes and are independent of the devices. Furthermore, since Iout=Iref, it can be concluded that the first current $I_{ref}$ generated by the first current source unit is given by:

$$I_{ref} = \frac{2}{\mu_n C_{ox}\left(\frac{W}{L}\right)_1} * \frac{1}{R_s^2} * \left(1 - \frac{1}{\sqrt{N1}}\right)^2. \quad (1)$$

By this token, since the substrates of the first MOS transistor M1 and the second MOS transistor M2 are grounded, while the substrates of the third MOS transistor M3 and the fourth MOS transistor M4 are connected to the power supply, the first current Iref generated by the first current source unit will not have a substrate bias effect.

Additionally, referring to FIG. 4, the second current source unit includes a fifth MOS transistor M5, a sixth MOS transistor M6, a seventh MOS transistor M7, an eighth MOS transistor M8, and a second resistor Rr. The sources of the fifth MOS transistor M5 and the sixth MOS transistor M6 are both grounded, thus grounding their substrates as well. The drain of the fifth MOS transistor M5 is connected to the drain of the seventh MOS transistor M7, which is also connected to the gates of the seventh MOS transistor M7 and the eighth MOS transistor M8. The source of the seventh MOS transistor M7 is connected to one end of the second resistor Rr, while the other end of the second resistor Rr is connected to the source of the eighth MOS transistor M8. The drain and gate of the sixth MOS transistor M6 are connected and linked to the gate of the fifth MOS transistor M5 and the drain of the eighth MOS transistor M8. As shown in FIG. 4, when calculating the current generated by the second current source unit, the ratio of the width-to-length ratio of the eighth MOS transistor M8 to the width-to-length ratio of the seventh MOS transistor M7 is set as N2, that is, $$\frac{\left(\frac{W}{L}\right)_8}{\left(\frac{W}{L}\right)_7} = N2;$$

wherein $$\left(\frac{W}{L}\right)_8, \left(\frac{W}{L}\right)_7$$

represent the width-to-length ratios of the eighth MOS transistor M8 and the seventh MOS transistor M7, respectively; the current generated by the second current source unit is denoted as the second current $I_{charge}$, and the resistance value of the second resistor is denoted as Rr. It's seen that, $$I_{charge} = \frac{V_T * \ln N_2}{R_r}, \quad (2)$$

where VT represents a thermal voltage which is a constant parameter that is related to the process, varying across different processes and independent of the devices. By this token, since the substrates of the fifth MOS transistor M5 and the sixth MOS transistor M6 are grounded, while the substrate of the seventh MOS transistor M7 is connected to the power supply, and the substrate of the eighth MOS transistor M8 is connected to the source of the eighth MOS transistor M8, thus the second current Icharge generated by the second current source unit will also not have a substrate bias effect.

It's seen that, the first current Iref and the second current Icharge without a substrate bias effect are generated by the first current source unit and the second current source unit, respectively, and then should be connected to the RC oscillator circuit. Therefore, in this invention, the first current Iref generated by the first current source unit and the second current Icharge generated by the second current source unit are proportionally replicated, so that the current produced by the second current source unit has two identical replicated currents Icharge1 and Icharge2, which are then input into the corresponding devices. Specifically, referring to FIG. 2, the MOS transistor M0 is proportionally mirrored with the current of the fourth MOS transistor M4, by designing the width-to-length ratios of the fourth MOS transistor M4 and the MOS transistor MO to be equal. Furthermore, the MOS transistor M9 is proportionally mirrored with the current of the sixth MOS transistor M6, by designing the width-to-length ratios of the sixth MOS transistor M6 and the MOS transistor M9 to be equal. Additionally, by setting the width-to-length ratio of the MOS transistors M9 and M10, the currents on the MOS transistors M9 and M10 can be made equal, that is, the current on the MOS transistor M10 is the same as that on the sixth MOS transistor M6. The MOS transistors M11 and M12 are proportionally mirrored with the current of the MOS transistor M10, by designing the width-to-length ratios of the MOS transistors M10, M11, and M12 to be equal. The technique of proportionally replicating an existing current is a common technical means for those skilled in the art and will not be detailed here. Specifically, after the current of the fourth MOS transistor M4 (the first current Iref) is mirrored by the MOS transistor MO, the first current Iref is input to the non-inverting inputs of the two comparators. The MOS transistors M11 and M12 respectively mirror the current of the MOS transistor M10 (the second current Icharge), forming the second currents Icharge1 and Icharge2. Thus, the sources of the MOS transistors M11 and M12 respectively form the two output terminals of the second current unit, and the second current Icharge1 is input to the first oscillating capacitor Cint1, the oscillating MOS transistor Mn1, and the inverting input of the comparator COMP1. Correspondingly, the second current Icharge2 is input to the second oscillating capacitor Cint2, the oscillating MOS transistor Mn2, and the inverting input of the comparator COMP2.

As described above, after the replicated first current Iref and the second current Icharge are input to the corresponding devices, combining equations (1) and (2) and the equation:

$$F=\frac{1}{2Tint}=\frac{1}{2K*Cint*Rref}$$

described in the background, where Rref represents the resistance value of the oscillation resistor Rref, and the frequency F of the output clock signal OUT1 of the RC oscillator circuit can be derived as:

$$F=\frac{\mu_n C_{ox}\left(\frac{W}{L}\right)_1*V_T*\ln N_2}{2*C_{int}}*\frac{1}{\left(1-\frac{1}{\sqrt{N1}}\right)^2}*\frac{R_s^2}{R_r R_{ref}}. \quad (3)$$

Furthermore, as noted above, the clock signal OUT1 is shaped by two inverters INV1 and INV2 before outputting the final clock signal OUT0. Therefore, the frequency F0 of the clock signal OUT0 is identical to the frequency F of the clock signal OUT1. From equation (3), it can be seen that the frequency F of the final clock signal OUT1 (which is also the frequency F0 of the clock signal OUT0) not only eliminates the substrate bias effect but also compensates for the process temperature deviation caused by the resistors (the oscillation resistor Rref, the first resistor Rs, and the second resistor Rr) since the resistance can be compensated, thus reducing the overall impact. Moreover, VT represents a positive temperature coefficient, $\mu_n$ represents a negative temperature coefficient, so the temperature characteristics are compensated. Therefore, the output frequency F0 of the RC oscillator circuit in this invention is unaffected by substrate bias effects and resistance variations, resulting in a stable frequency of the output clock signal with minimal deviation, and greatly enhancing the reliability and stability of the RC oscillator circuit.

The above-mentioned embodiments only represent several embodiments of the present invention, and the descriptions thereof are relatively specific and detailed, but should not be construed as limiting the scope of the patent invention. It should be pointed out that for those skilled in the art, several modifications and improvements can be made without departing from the concept of the present invention, which all belong to the protection scope of the present invention. Therefore, the scope of protection of the patent of the present invention shall be subject to the appended claims.

What is claimed is:

1. An RC oscillator circuit, comprising a first current source unit, a second current source unit, an oscillation resistor, a first oscillation capacitor, a second oscillation capacitor, two oscillation MOS transistors, two comparators, and an RS latch, wherein an input terminal of the first current source unit and an input terminal of the second current source unit are connected to an external power supply, the first current source unit is configured to generate a first current, an output terminal of the first current source unit is connected to one end of the oscillation resistor and non-inverting inputs of the two comparators, and the other end of the oscillation resistor is grounded;

the second current source unit is configured to generate a second current and provided with two output terminals, one of the output terminals is connected to one end of the first oscillation capacitor and an inverting input of one of the two comparators, with the other end of the first oscillation capacitor grounded, and the other of the output terminals is connected to one end of the second oscillation capacitor and an inverting input of the other of the two comparators, with the other end of the second oscillation capacitor grounded;

sources of the two oscillation MOS transistors are grounded, drains of the two oscillation MOS transistors are connected to one end of a corresponding oscillation capacitor, and gates of the two oscillation MOS transistors are both connected to an output of the RS latch; output terminals of the two comparators are connected to an input terminal of the RS latch, and the RS latch is configured to output a clock signal;

wherein the first current source unit comprises a first MOS transistor, a second MOS transistor, a third MOS transistor, a fourth MOS transistor, and a first resistor; sources of the first and second MOS transistors are grounded, a drain of the first MOS transistor and a gate of the second MOS transistor are connected together to one end of the first resistor, the other end of the first resistor is connected to a gate of the first MOS transistor and a drain of the third MOS transistor, drains of the third and fourth MOS transistors are connected to the external power supply, and the drain and gate of the fourth MOS transistor are connected together to a gate of the third MOS transistor and a drain of the second MOS transistor;

wherein the second current source unit comprises a fifth MOS transistor, a sixth MOS transistor, a seventh MOS transistor, an eighth MOS transistor, and a second resistor; sources of the fifth and sixth MOS transistors are grounded, drains of the fifth and seventh MOS transistors are connected together to gates of the seventh and eighth MOS transistors, a source of the seventh MOS transistor and one end of the second resistor are connected to the external power supply, with the other end of the second resistor connected to a source of the eighth MOS transistor; and the drain and gate of the sixth MOS transistor are connected together to a gate of the fifth MOS transistor and a drain of the eighth MOS transistor.

2. The RC oscillator circuit according to claim 1, wherein the third MOS transistor and the fourth MOS transistor have a same width-to-length ratio.

3. The RC oscillator circuit according to claim 2, wherein a gate-source voltage of the first MOS transistor is denoted as $V_{GS1}$, a current generated by the first current source unit is denoted as $I_{ref}$, a resistance value of the first resistor is denoted as Rs, a gate-source voltage of the second MOS transistor is denoted as $V_{GS2}$, and a drain current of the second MOS transistor is denoted as $I_{out}$, based on the KVL equation, it's yielded that:

$$V_{GS1}=\sqrt{\frac{2Iref}{\mu_n C_{ox}\left(\frac{W}{L}\right)_1}}+V_{TH1},$$

$$V_{GS2}=\sqrt{\frac{2Iout}{\mu_n C_{ox}\left(\frac{W}{L}\right)_2}}+V_{TH2},$$

where $$\left(\frac{W}{L}\right)_2,\left(\frac{W}{L}\right)_1$$

represent a width-to-length ratio of the second MOS transistor and a width-to-length ratio of the first MOS transistor respectively, and a ratio of the width-to-length ratio of the second MOS transistor to the width-to-length ratio of the first MOS transistor is denoted as N1; $V_{TH1}$ and $V_{TH2}$ represent threshold voltages of the first and second MOS transistors, respectively; $\mu_n$ represents a channel mobility, and $C_{ox}$ represents a gate oxide capacitance per unit area; furthermore, assuming $I_{out}=I_{ref}$, a current $I_{ref}$ generated by the first current source unit can be obtained as follows:

$$I_{ref} = \frac{2}{\mu_n C_{ox}\left(\frac{W}{L}\right)_1} * \frac{1}{R_s^2} * \left(1 - \frac{1}{\sqrt{N1}}\right)^2. \tag{1}$$

4. The RC oscillator circuit according to claim 3, wherein a ratio of a width-to-length ratio of the eighth MOS transistor to a width-to-length ratio of the seventh MOS transistor is denoted as N2, a current generated by the second current source unit is denoted as $I_{charge}$, and a resistance vlue of the second resistor is denoted as $R_r$, thus:

$$I_{charge} = \frac{V_T * \ln N_2}{R_r}, \tag{2}$$

where VT represents a thermal voltage.

5. The RC oscillator circuit according to claim 4, wherein the current produced by the first current source unit and the current produced by the second current source unit are proportionally replicated, and the current produced by the second current source unit has two identical replicated currents which are input into corresponding devices.

6. The RC oscillator circuit according to claim 5, wherein by combining equations (1) and (2), a frequency F of the output clock signal of the RC oscillator can be obtained as follows:

$$F = \frac{\mu_n C_{ox}\left(\frac{W}{L}\right)_1 * V_T * \ln N_2}{2 * C_{int}} * \frac{1}{\left(1 - \frac{1}{\sqrt{N1}}\right)^2} * \frac{R_s^2}{R_r R_{ref}},$$

where $R_{ref}$ represents a resistance value of the oscillator resistor.

* * * * *